US009640553B2

(12) United States Patent
Jiang

(10) Patent No.: US 9,640,553 B2
(45) Date of Patent: May 2, 2017

(54) THIN-FILM TRANSISTOR (TFT), MANUFACTURING METHOD THEREOF, ARRAY SUBSTRATE AND DISPLAY DEVICE

(71) Applicant: BOE Technology Group Co., Ltd., Beijing (CN)

(72) Inventor: Chunsheng Jiang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/762,076

(22) PCT Filed: Nov. 21, 2014

(86) PCT No.: PCT/CN2014/091883
§ 371 (c)(1),
(2) Date: Jul. 20, 2015

(87) PCT Pub. No.: WO2016/019652
PCT Pub. Date: Feb. 11, 2016

(65) Prior Publication Data
US 2016/0260744 A1 Sep. 8, 2016

(30) Foreign Application Priority Data
Aug. 5, 2014 (CN) .......................... 2014 1 0381849

(51) Int. Cl.
*H01L 21/20* (2006.01)
*H01L 21/36* (2006.01)
(Continued)

(52) U.S. Cl.
CPC ...... *H01L 27/1214* (2013.01); *H01L 27/1259* (2013.01); *H01L 29/786* (2013.01)

(58) Field of Classification Search
CPC .................................................. H01L 27/1214
(Continued)

(56) References Cited

U.S. PATENT DOCUMENTS 9,324,739 B1 * 4/2016 Shih .................... H01L 29/7869
9,536,993 B2 * 1/2017 Shimoda ........... H01L 29/66969
(Continued)

FOREIGN PATENT DOCUMENTS

CN 103098185 A 5/2013
CN 103296087 A 9/2013
(Continued)

OTHER PUBLICATIONS

Jul. 4, 2016—(CN)—First Office Action Appn 201410381849.8 with English Tran.
(Continued)

*Primary Examiner* — Igwe U Anya
(74) *Attorney, Agent, or Firm* — Banner & Witcoff, Ltd.

(57) ABSTRACT

A thin-film transistor (TFT), a manufacturing method thereof, an array substrate and a display device are disclosed. The method for manufacturing the a TFT comprises the step of forming a gate electrode, a gate insulating layer, an active area, a source electrode and a drain electrode on a base substrate. The active area (4) is made of a ZnON material. When the gate insulating layer is formed, a material for forming the gate insulating layer is subjected to control treatment, so that a sub-threshold amplitude of the TFT is less than or equal to 0.5 mV/dec. The manufacturing method reduces the sub-threshold amplitude of the TFT and improves the semiconductor characteristic of the TFT.

12 Claims, 2 Drawing Sheets

(51) Int. Cl.
*H01L 27/12* (2006.01)
*H01L 29/786* (2006.01)

(58) Field of Classification Search
USPC .......................................................... 438/478
See application file for complete search history.

(56) References Cited

U.S. PATENT DOCUMENTS

| | | | | |
|---|---|---|---|---|
| 2008/0128702 A1* | 6/2008 | Yamazaki | ............... | H01L 27/12 257/66 |
| 2009/0278120 A1* | 11/2009 | Lee | ..................... | H01L 29/7869 257/43 |
| 2010/0001346 A1* | 1/2010 | Ye | ..................... | H01L 21/02521 257/347 |
| 2010/0102359 A1* | 4/2010 | Khan | ................ | H01L 21/02057 257/194 |
| 2013/0221343 A1* | 8/2013 | Son | ................... | H01L 29/78618 257/43 |
| 2013/0327095 A1 | 12/2013 | Muller et al. | | |
| 2015/0021599 A1* | 1/2015 | Ridgeway | ............. | C23C 16/345 257/43 |
| 2015/0064860 A1* | 3/2015 | Kim | ................... | H01L 21/02521 438/197 |
| 2015/0206978 A1* | 7/2015 | Miki | ..................... | H01L 29/408 257/43 |
| 2016/0043228 A1* | 2/2016 | Jiang | ................ | H01L 21/02565 257/43 |
| 2016/0104769 A1* | 4/2016 | Verreck | ............... | H01L 29/0688 257/9 |

FOREIGN PATENT DOCUMENTS

| | | |
|---|---|---|
| CN | 103403873 A | 11/2013 |
| JP | 200754692 A | 3/2007 |

OTHER PUBLICATIONS

Apr. 22, 2015—International Search Report and Written Opinion App PCT/CN2014/091883 with Eng Tran.
Jan. 13, 2017—(CN) Second Office Action Appn 201410381849.8 with English Tran.

* cited by examiner

THIN-FILM TRANSISTOR (TFT), MANUFACTURING METHOD THEREOF, ARRAY SUBSTRATE AND DISPLAY DEVICE

The application is a U.S. National Phase Entry of International Application No. PCT/CN2014/091883 filed on Nov. 21, 2014, designating the United States of America and claiming priority to Chinese Patent Application No. 201410381849.8, filed Aug. 5, 2014. The present application claims priority to and the benefit of the above-identified applications and the above-identified applications are incorporated by reference herein in their entirety.

TECHNICAL FIELD

Embodiments of the present invention relate to a thin-film transistor (TFT), a manufacturing method thereof, an array substrate and a display device.

BACKGROUND

TFTs have been currently widely applied in flat panel display devices due to good switching characteristic. In general, the TFT includes a gate electrode, an active area, a source electrode and a drain electrode. The source electrode and the drain electrode are respectively disposed at both ends of the active area and respectively make contact with the active area. For instance, when the voltage of the gate electrode is higher than the threshold voltage thereof, the source electrode and the drain electrode are conducted through the active area, and carriers flow from the source electrode to the drain electrode or from the drain electrode to the source electrode.

The active area of the TFT may be made of zinc oxynitride (ZnON) material. Compared with indium gallium zinc oxide (IGZO), when the ZnON material becomes electrical conductive, nitrogen vacancies (NVs) therein have high mobility, so that the conductivity of the TFT can be greatly improved. In addition, as the price of the ZnON material is cheaper than that of the IGZO material, the adoption of the ZnON material to form the active area can greatly reduce the manufacturing cost of the TFT.

However, different nitrogen contents in the ZnON material of the active area will result in different mobility. Moreover, in the electrical conduction process of the TFT and the annealing process of indium tin oxide (ITO) of a display substrate (e.g., an array substrate) of a display device, nitrogen in the active area will migrate to an adjacent gate insulating layer or an adjacent passivation layer due to the diffusion effect, so that the mobility of the NVs in the active area can be reduced, and hence the sub-threshold amplitude of the TFT can be increased. Moreover, the increase of the sub-threshold amplitude will severely affect the semiconductor characteristic of the TFT.

SUMMARY

Embodiments of the present invention provide a thin film transistor (TFT), a manufacturing method thereof, an array substrate and a display device. In the method for manufacturing the TFT, which is provided by an embodiment of the present invention, the material for forming a gate insulating layer is subjected to control treatment when the gate insulating layer is formed, so that the nitrogen content in the gate insulating layer can be greatly improved. In this way, when the TFT is in the working state, nitrogen in the gate insulating layer can be continuously supplemented to an active area, so that the mobility of NVs in the active area can be greatly improved. Therefore, the sub-threshold amplitude of the TFT can be reduced and the semiconductor characteristic of the TFT can be improved.

At least one embodiment of the present invention provides a method for manufacturing a TFT, which comprises the step of forming a gate electrode, a gate insulating layer, an active area, a source electrode and a drain electrode on a base substrate. The active area is made of a ZnON material. When the gate insulating layer is formed, the material for forming the gate insulating layer is subjected to control treatment, so that the sub-threshold amplitude of the TFT can be less than or equal to 0.5 mV/dec.

For instance, the gate insulating layer includes a first gate insulating layer and a second gate insulating layer which is formed between the first gate insulating layer and the active area.

For instance, the step of performing control treatment on the material for forming the gate insulating layer when the gate insulating layer is formed may include: introducing gases $SiN_x$, $N_2$ and $NH_3$ according to the gas volume flow rate of 140-180 sccm for $SiN_x$, 1,750-2,250 sccm for $N_2$ and 700-900 sccm for $NH_3$ for deposition to form the first gate insulating layer; and introducing gases $SiN_x$, $N_2$ and $NH_3$ according to the gas volume flow rate of 140-180 sccm for $SiN_x$, ≥3,500 sccm for $N_2$ and ≥1,400 sccm for $NH_3$ for deposition to form the second gate insulating layer, wherein X is ranged from 1 to 4/3.

For instance, the thickness of the first gate insulating layer may be ranged from 1,500 Å to 2,000 Å; and the thickness of the second gate insulating layer may be ranged from 500 Å to 1,000 Å.

For instance, the step of performing control treatment on the material for forming the gate insulating layer when the gate insulating layer is formed may include: introducing gases $SiH_4$ and $NH_3$, and forming the gate insulating layer by deposition according to the gas volume flow ratio of $SiH_4:NH_3 \leq 1:90$.

For instance, the step of performing control treatment on the material for forming the gate insulating layer when the gate insulating layer is formed may include: firstly, introducing gases $SiN_x$, $N_2$ and $NH_3$ according to the gas volume flow rate of 140-180 sccm for $SiN_x$, 1,750-2,250 sccm for $N_2$ and 700-900 sccm for $NH_3$ for deposition to form the gate insulating layer, in which X is ranged from 1 to 4/3; and secondly, ionizing $NH_3$ and bombarding produced nitrogen ions to a surface of the gate insulating layer facing the active area.

For instance, the thickness of the gate insulating layer may be ranged from 2,000 Å to 4,000 Å.

For instance, after the step of forming the active area and before the step of forming the source electrode and the drain electrode, the method may further comprise: forming an etch barrier layer; and forming a first via hole and a second via hole in the etch barrier layer respectively corresponding to both ends of the active area. The source electrode is connected with the active area via the first via hole, and the drain electrode is connected with the active area via the second through h For instance, the active area is formed over the gate electrode, or the gate electrode is formed over the active area.

Another embodiment of the present invention further provides a thin film transistor (TFT), which is manufactured by any foregoing manufacturing method.

Another embodiment of the present invention further provides an array substrate, which comprises any foregoing TFT.

Another embodiment of the present invention further provides a display device, which comprises any foregoing array substrate.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

REFERENCE NUMERALS

1. Base Substrate; 2. Gate Electrode; 3. Gate Insulating Layer; 31. First Gate Insulating Layer; 32. Second Gate Insulating Layer; 4. Active Area; 5. Source Electrode; 6. Drain Electrode; 7. Etch Barrier Layer; 8. First Via hole; 9. Second Via hole.

DETAILED DESCRIPTION

For more clear understanding of the technical proposals of the present invention, further detailed description will be given below to the TFT, the manufacturing method thereof, the array substrate and the display device, provided by the present invention, with reference to the accompanying drawings and the preferred embodiments. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Embodiment 1

Figure 1:
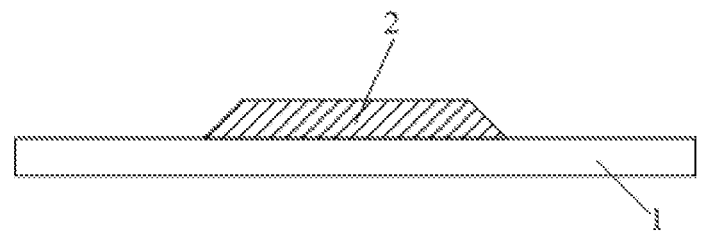
FIG. 1 illustrates the step of forming a gate electrode in the embodiment 1 of the present invention.
Figure 2:
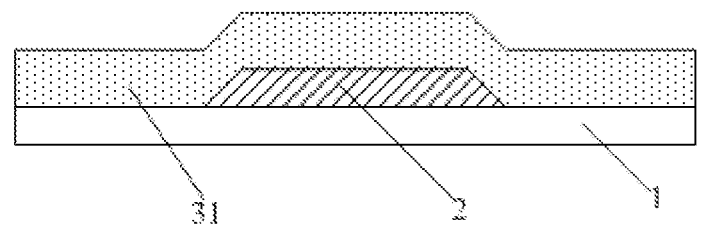
FIG. 2 illustrates the step of forming a first gate insulating layer in the embodiment 1 of the present invention.
Figure 3:
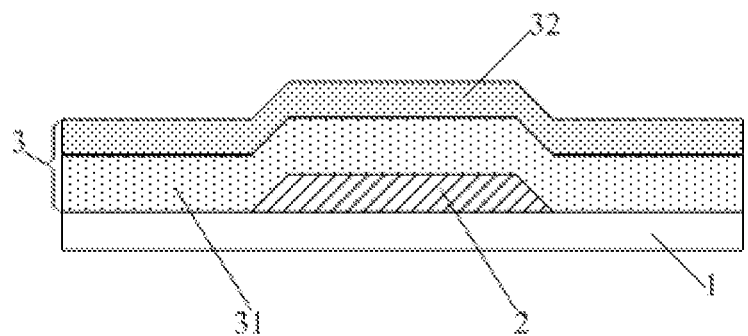
FIG. 3 illustrates the step of forming a second gate insulating layer in the embodiment 1 of the present invention.
Figure 4:
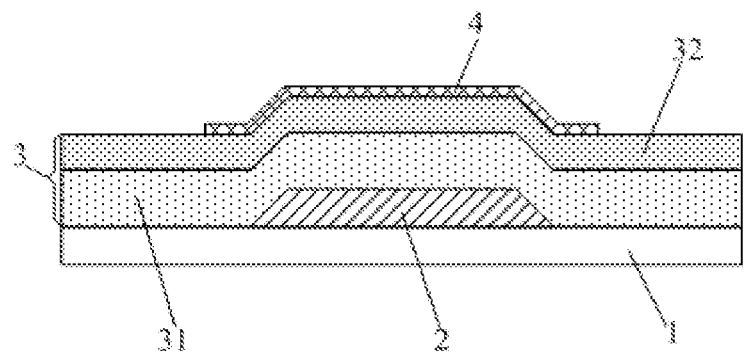
FIG. 4 illustrates the step of forming an active area in the embodiment 1 of the present invention.
Figure 5:
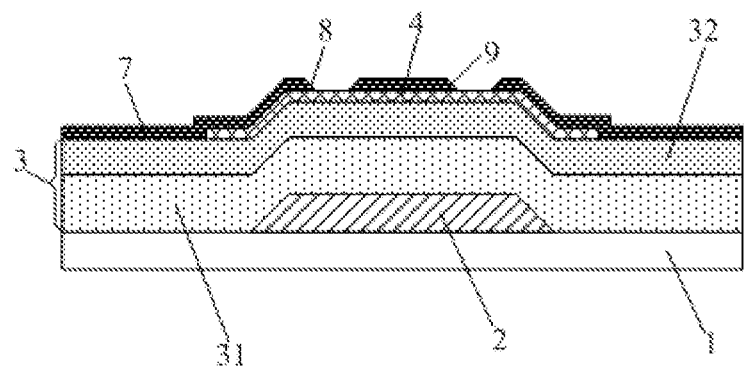
FIG. 5 illustrates the step of forming an etch barrier layer, a first via hole and a second via hole in the embodiment 1 of the present invention.
Figure 6:
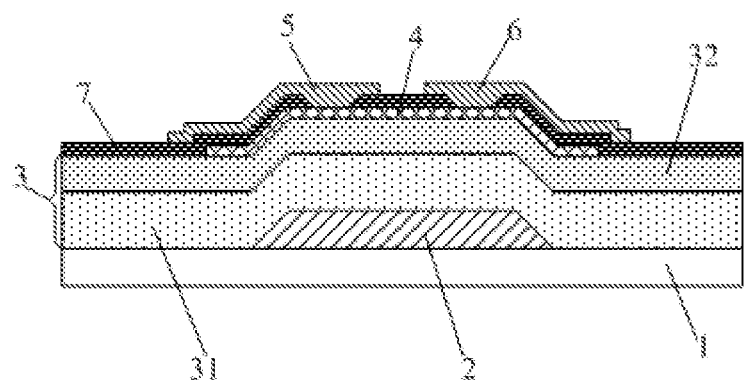
FIG. 6 illustrates the step of forming a source electrode and a drain electrode in the embodiment 1 of the present invention.

The embodiment provides a method for manufacturing a thin film transistor (TFT); as illustrated in FIGS. 1 to 6, the method comprises the step of forming a gate electrode 2, a gate insulating layer 3, an active area 4, a source electrode 5 and a drain electrode 6 on a base substrate 1. The active area 4 is made of a ZnON material. When the gate insulating layer 3 is formed, the material for forming the gate insulating layer 3 is subjected to control treatment, so that nitrogen in the gate insulating layer 3 can be continuously supplemented to the active area 4 when the TFT is in the working state, so that the sub-threshold amplitude of the TFT is less than or equal to 0.5 mV/dec.

The sub-threshold amplitude refers to the slope of the curve portion from OFF state to ON state in a semiconductor output characteristic curve. When the slope is smaller, the response speed of the TFT from the OFF state to the ON state is rapider, and correspondingly, the sub-threshold amplitude characteristic is better and the performances of the TFT are better. When the slope is larger, the response speed of the TFT from the OFF state to the ON state is slower, and correspondingly, the sub-threshold amplitude characteristic is poorer and the performances of the TFT are also poorer.

It should be noted that the working state of the TFT refers to that the TFT is at a linear state and a saturation state.

For instance, in the embodiment, the active area 4 is formed over the gate electrode 2, and the gate electrode 2, the gate insulating layer 3, the active area 4, the source electrode 5 and the drain electrode 6 are formed on the base substrate 1 in sequence, namely the TFT in the embodiment adopts a bottom-gate structure. For instance, the gate electrode 2, the active area 4, the source electrode 5 and the drain electrode 6 may be formed by the traditional patterning process. No further description will be given here.

For instance, in the embodiment, the gate insulating layer 3 may include a first insulating layer 31 and a second gate insulating layer 32, and the second insulating layer 32 is formed between the first gate insulating layer 31 and the active area 4. When the gate insulating layer 3 is formed, a material for forming the gate insulating layer 3 is subjected to control treatment. One example of the control treatment method is described below.

Gases $SiN_x$, $N_2$ and $NH_3$ are introduced according to the gas volume flow rate of 140-180 sccm for $SiN_x$, 1,750-2,250 sccm for $N_2$ and 700-900 sccm for $NH_3$ for deposition to form the first gate insulating layer 31; and gases $SiN_x$, $N_2$ and $NH_3$ are introduced according to the gas volume flow rate of 140-180 sccm for $SiN_x$, ≥3,500 sccm for $N_2$ and ≥1,400 sccm for $NH_3$ for deposition to form the second gate insulating layer 32. Herein, X is ranged from 1 to 4/3.

For instance, the first gate insulating layer 31 and the second gate insulating layer 32 are formed by a chemical vapor deposition (CVD) method. The method includes: firstly, introducing gases $N_2$ and $NH_3$ into a CVD chamber according to the above gas volume flow rates; secondly, introducing gases $SiN_x$, $N_2$ and $NH_3$ according to the above gas volume flow rates under the deposition atmosphere for the deposition of a $SiN_x$ layer; and finally, forming the first gate insulating layer 31 and the second gate insulating layer 32 with different nitrogen contents.

As the second gate insulating layer 32 is tightly attached to the active area 4 and has comparatively higher nitrogen content, when the TFT is in the working state, the nitrogen in the second gate insulating layer 32 can be continuously supplemented to the active area 4 and be at effective conductive positions in the active area 4. The nitrogen at the effective conductive positions can further improve the mobility of NVs in the active area 4, namely further improving the mobility of carriers in the active area 4, so that the sub-threshold amplitude of the TFT can be reduced, and hence the semiconductor characteristic of the TFT can be improved.

It should be noted that the effective conductive position refers to the position of an effective vacancy in the active area 4 made of a ZnON material. When the TFT is electrified, under the action of a gate electric field, the nitrogen at the effective vacancy position can be quickly expelled from the effective vacancy position, so that the effective vacancy position can be retained, and hence the active area 4 can quickly achieve semi-vacancy conductance. Therefore, the TFT can achieve rapid conduction under the electrified condition, namely be quickly developed from OFF state to ON state, and hence not only the sub-threshold amplitude of the TFT can be reduced but also the semiconductor characteristic of the TFT can be improved.

For instance, the thickness of the first gate insulating layer 31 may be ranged from 1,500 Å A to 2,000 Å; and the thickness of the second gate insulating layer 32 may be ranged from 500 Å to 1,000 Å. In this way, not only the gate insulating layer 3 between the gate electrode 2 and the active area 4 can have good insulation effect but also the nitrogen in the gate insulating layer 3 can be continuously supplemented to the active area 4 when the TFT is in the working state.

For instance, in the embodiment, after the step of forming the active area 4 and before the step of forming the source electrode 5 and the drain electrode 6, the method may further comprise the step of forming an etch barrier layer 7. A first via hole 8 and a second via hole 9 are respectively formed in the etch barrier layer 7, corresponding to both ends of the active area 4. The source electrode 5 is connected with the active area 4 via the first via hole 8, and the drain electrode 6 is connected with the active area 4 via the second via hole 9. The etch barrier layer 7 can protect the active area 4 from being subjected to etching damage when the source electrode 5 and the drain electrode 6 are formed through etching.

It should be noted that the etch barrier layer may be not formed between the active area 4 and the source electrode 5 and the drain electrode 6 as long as the active area 4 does not suffer from etching damage when the source electrode 5 and the drain electrode 6 are formed through etching.

Embodiment 2

The embodiment provides a method for manufacturing a TFT. As different from the embodiment 1, the step of performing control treatment on the material for forming the gate insulating layer, when the gate insulating layer is formed, includes: introducing $SiH_4$ and $NH_3$, and forming the gate insulating layer by deposition according to the gas volume flow ratio of $SiH_4:NH_3 \leq 1:90$.

For instance, in the embodiment, the thickness of the gate insulating layer may be ranged from 2,000 Å to 4,000 Å.

As the traditional gate insulating layer is usually formed by deposition according to the gas volume flow ratio of $SiH_4:NH_3=1:30$, in the embodiment, the nitrogen content in the gate insulating layer can be greatly improved due to the gas volume flow ratio of $SiH_4:NH_3$. In this way, when the TFT is in the working state, the nitrogen in the gate insulating layer can be continuously supplemented to the active area and be at effective conductive positions in the active area. The nitrogen at the effective conductive positions greatly improves the mobility of NVs in the active area, namely greatly improving the mobility of carriers in the active area. Therefore, the sub-threshold amplitude of the TFT can be reduced and the semiconductor characteristic of the TFT can be improved.

The manufacturing methods of other structures of the TFT in the embodiment are the same as those in the embodiment 1. No further description will be given here.

Embodiment 3

The embodiment provides a method for manufacturing a TFT. As different from the embodiments 1 and 2, the control treatment on the material for forming the gate insulating layer when the gate insulating layer is formed is, for instance, described below:

firstly, introducing gases $SiN_x$, $N_2$ and $NH_3$ according to the gas volume flow rate of 140-180 sccm for $SiN_x$, 1,750-2,250 sccm for $N_2$ and 700-900 sccm for $NH_3$ for deposition to form the gate insulating layer, in which X is ranged from 1 to 4/3; and secondly, ionizing $NH_3$ and bombarding produced nitrogen ions to a surface of the gate insulating layer facing the active area.

In general, the number of the nitrogen ions bombarded to the surface of the gate insulating layer can reach more than $10^{15}/cm^2$, so that the nitrogen content in the gate insulating layer can be greatly improved. In this way, when the TFT is in the working state, the nitrogen in the gate insulating layer can be continuously supplemented to the active area and be at effective conductive positions in the active area. Thus, the nitrogen at the effective conductive positions greatly improves the mobility of NVs in the active area, namely greatly improving the mobility of carriers in the active area. Therefore, the sub-threshold amplitude of the TFT can be reduced and the semiconductor characteristic of the TFT can be improved.

The manufacturing methods for other structures of the TFT in the embodiment are the same as those of the embodiment 1 or 2. No further description will be given here.

Embodiment 4

The embodiment provides a method for manufacturing a TFT. As different from the embodiments 1 to 3, the gate electrode is formed over the active area, namely the TFT in the embodiment adopts a top-emission structure.

The manufacturing methods of other structures of the TFT in the embodiment are the same as those of any one of embodiments 1 to 3. No further description will be given here.

In the method for manufacturing the TFT, provided by the embodiments 1 to 4, the nitrogen content in the gate insulating layer is greatly improved by the control treatment on the material for forming the gate insulating layer when the gate insulating layer is formed. In this way, when the TFT is in the working state, the nitrogen in the gate insulating layer can be continuously supplemented to the active area and be at effective conductive positions in the active area. The nitrogen at the effective conductive positions greatly improves the mobility of NVs in the active area, namely greatly improving the mobility of carriers in the active area. Therefore, the sub-threshold amplitude of the TFT can be reduced and the semiconductor characteristic of the TFT can be improved.

Embodiment 5

The embodiment provides a TFT, which is manufactured by the manufacturing method according to any one of embodiments 1 to 4.

The sub-threshold amplitude of the TFT manufactured by the manufacturing method according to any one of embodiments 1 to 4 is less than or equal to 0.5 mV/dec. Compared with the conventional TFT, the sub-threshold amplitude thereof is greatly reduced and the semiconductor characteristic is also greatly improved.

Embodiment 6

The embodiment provides an array substrate, which comprises any foregoing TFT provided by the embodiment 5.

With any foregoing TFT provided by the embodiment 5, the performances of the array substrate can be further improved.

Embodiment 7

The embodiment provides a display device, which comprises any foregoing array substrate provided by the embodiment 6.

With any foregoing array substrate provided by the embodiment 6, the performances of the display device can be further improved.

For instance, the display device provided by the embodiment of the present invention may be any product or component with display function such as a liquid crystal display (LCD) panel, an LCD TV, a display, an organic light-emitting diode (OLED) panel, an OLED TV, a mobile phone, a navigator and a watch.

As the display device provided by the embodiment of the present invention adopts any foregoing array substrate, the performances of the display device can be further improved.

The foregoing is only the preferred embodiments of the present invention and not intended to limit the scope of protection of the present invention. The scope of protection of the present invention should be defined by the appended claims.

The application claims priority to the Chinese patent application No. 201410381849.8, filed Aug. 5, 2014, the disclosure of which is incorporated herein by reference as part of the application.

The invention claimed is:

1. A method for manufacturing a thin-film transistor (TFT), comprising the step of forming a gate electrode, a gate insulating layer, an active area, a source electrode and a drain electrode on a base substrate, wherein
the active area is made from a ZnON material; and
in the process that the gate insulating layer is formed, a material for forming the gate insulating layer is subjected to control treatment, so that a sub-threshold amplitude of the TFT is less than or equal to 0.5 mV/dec.

2. The manufacturing method according to claim 1, wherein the gate insulating layer includes a first gate insulating layer and a second gate insulating layer, and the second gate insulating layer is formed between the first gate insulating layer and the active area.

3. The manufacturing method according to claim 2, wherein a thickness of the first gate insulating layer is ranges from 1,500 Å to 2,000 Å; and a thickness of the second gate insulating layer is ranges from 500 Å to 1,000 Å.

4. The manufacturing method according to claim 3, after the step of forming the active area and before the step of forming the source electrode and the drain electrode, further comprising:

forming an etch barrier layer; and
forming a first via hole and a second via hole in the etch barrier layer respectively corresponding to both ends of the active layer, wherein the source electrode is connected with the active area via the first via hole; and the drain electrode is connected with the active area via the second via hole.

5. The manufacturing method according to claim 2, after the step of forming the active area and before the step of forming the source electrode and the drain electrode, further comprising:

forming an etch barrier layer; and
forming a first via hole and a second via hole in the etch barrier layer respectively corresponding to both ends of the active layer, wherein the source electrode is connected with the active area via the first via hole; and the drain electrode is connected with the active area via the second via hole.

6. The manufacturing method according to claim 2, wherein the active area is formed over the gate electrode, or the gate electrode is formed over the active area.

7. The manufacturing method according to claim 1, wherein the step of performing control treatment on the material for forming the gate insulating layer when the gate insulating layer is formed includes:

introducing gases $SiH_4$ and $NH_3$, and forming the gate insulating layer by deposition according to the gas volume flow ratio of $SiH_4:NH_3 \leq 1:90$.

8. The manufacturing method according to claim 6, wherein the thickness of the gate insulating layer ranges from 2,000 Å to 4,000 Å.

9. The manufacturing method according to claim 1, after the step of forming the active area and before the step of forming the source electrode and the drain electrode, further comprising:

forming an etch barrier layer; and
forming a first via hole and a second via hole in the etch barrier layer respectively corresponding to both ends of the active layer, wherein the source electrode is connected with the active area via the first via hole; and the drain electrode is connected with the active area via the second via hole.

10. The manufacturing method according to claim 1, wherein the active area is formed over the gate electrode, or the gate electrode is formed over the active area.

11. A thin film transistor (TFT) that is manufactured by the manufacturing method according to claim 1.

12. A display device comprising an array substrate comprising the thin film transistor (TFT) according to claim 11.

* * * * *